(12) United States Patent
Wertz

(10) Patent No.: US 7,473,104 B1
(45) Date of Patent: Jan. 6, 2009

(54) ELECTRICAL CONNECTOR HAVING IMPROVED TWO-HALF CONTACTS FOR LAND GRID ARRAY SOCKET

(75) Inventor: Darrell Wertz, Chandler, AZ (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/001,574

(22) Filed: Dec. 12, 2007

(51) Int. Cl.
*H01R 12/00* (2006.01)
(52) U.S. Cl. ........................................ 439/66
(58) Field of Classification Search ............ 439/66, 439/91, 591, 700
See application file for complete search history.

(56) References Cited

U.S. PATENT DOCUMENTS

| | | | |
|---|---|---|---|
| 5,653,598 A | 8/1997 | Whitaker | |
| 6,186,797 B1 | 2/2001 | Wang et al. | |
| 6,814,585 B2 * | 11/2004 | Bedell et al. | 439/66 |
| 7,255,573 B2 * | 8/2007 | He et al. | 439/66 |

* cited by examiner

*Primary Examiner*—Phuong K Dinh
(74) *Attorney, Agent, or Firm*—Wei Te Chung

(57) ABSTRACT

An electrical connector includes an insulative housing (2) and a number of contacts (1) received in the housing (2). Each contact (1) includes a first half (11) and a second half (12) distinctly separate from each other and capable of moving along up-to-down direction relative to each other, The first half (11) and the second half (12) have the same structure as each other. After reversing the first half (11) 180 degrees, the first half (11) and the second half (12) are in mirror images relative to each other. The first half (11) comprising a first interlinked portion (114) and a first contact engaging portion (113), and the second half (12) including a second interlinked portion (124) and a second contact engaging portion (124), the second interlinked portion (124) moveably interfitting with the first interlinked portion (114).

1 Claim, 4 Drawing Sheets

ELECTRICAL CONNECTOR HAVING IMPROVED TWO-HALF CONTACTS FOR LAND GRID ARRAY SOCKET

BACKGROUND OF THE INVENTION

1. Field of the Invention

The present invention relates to an electrical connector, and particularly to an electrical connector having improved two-half contacts for electrically connecting an electronic package, such as a land grid array (LGA) central processing unit (CPU), with a circuit substrate, such as a printed circuit board (PCB).

2. Description of the Prior Art

Connectors for removably mounting an LGA package on a PCB are known as LGA sockets. An LGA socket typically comprises a substantially flat insulative housing, which is positioned between the LGA and the PCB. The housing defines an array of passageways with electrical contacts received therein.

Various contacts for LGA sockets are disclosed in the prior art, such as U.S. Pat. Nos. 5,653,598, 6,186,797. Typically, a contact for an LGA socket comprises a retaining portion for engaging with a housing, a first spring arm inclinedly and upwardly extending from the retaining portion defines a first contacting portion extending beyond the upper surface of the housing for connecting with the LGA package and a second spring arm inclinedly and downwardly extending from the retaining portion defines a second contacting portion extending beyond the bottom surface of the housing for connecting with the PCB. Therefore, an electrical connection is established between the LGA package and the PCB.

The contacts with such inclinedly arranged spring arms can provide good elasticity when compressed by the LGA package. However, such structure of the contact makes the transverse distance, or the pitch, between two contacts along a transverse direction perpendicular to a mating direction between the contacts and the LGA package become too large and cannot be tightly arranged. As the socket is reduced in size and the number of the contacts are increased gradually because of quick development of technology. Improved contacts for an LGA socket with fine pitch and desirable elasticity are required to overcome the disadvantages of the conventional contacts.

SUMMARY OF THE INVENTION

Accordingly, the object of the present invention is to provide an electrical connector having a plurality of two-halves contacts capable of reduce the pitch between each two contacts.

To fulfill the above-mentioned object, an electrical connector includes an insulative housing and a number of contacts received in the housing. Each contact includes a first half and a second half distinctly separates from each other and capable of moving along up-to-down direction relative to each other. The first half and the second half have the same structure as each other. After reversing the first half 180 degrees, the first half and the second half are in mirror images relative to each other. The first half comprising a first interlinked portion and a first contact engaging portion, and the second half including a second interlinked portion and a second contact engaging portion, the second interlinked portion moveably interfitting with the first interlinked portion, at the end of the two contact engaging portion defines two mating portions for connecting to the LGA and the PCB, this configuration can reduce the distance between each two contacts.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
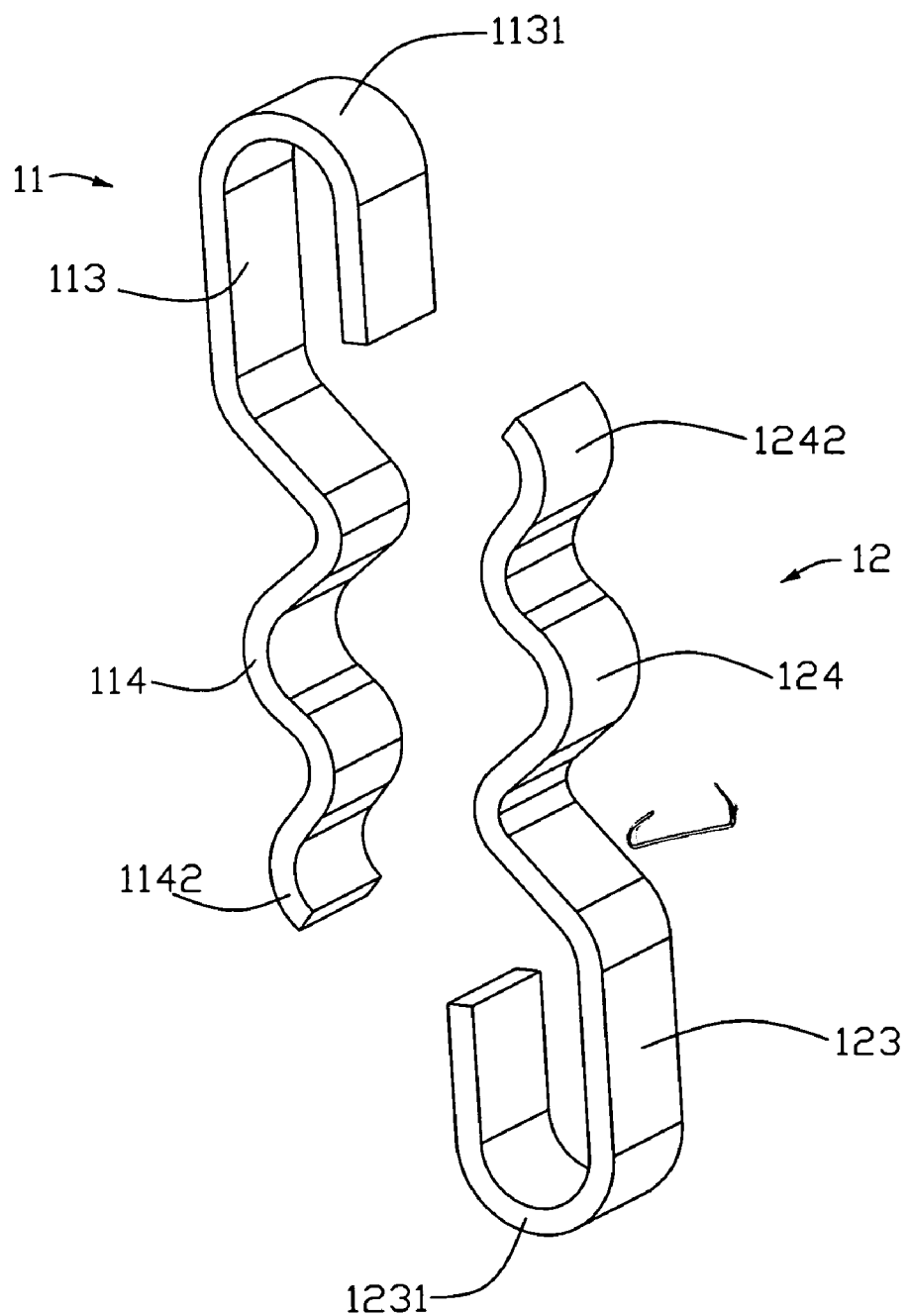
FIG. 1 is an exploded view of a contact of an electrical connector in accordance with the preferred embodiment of the present invention.
Figure 2:
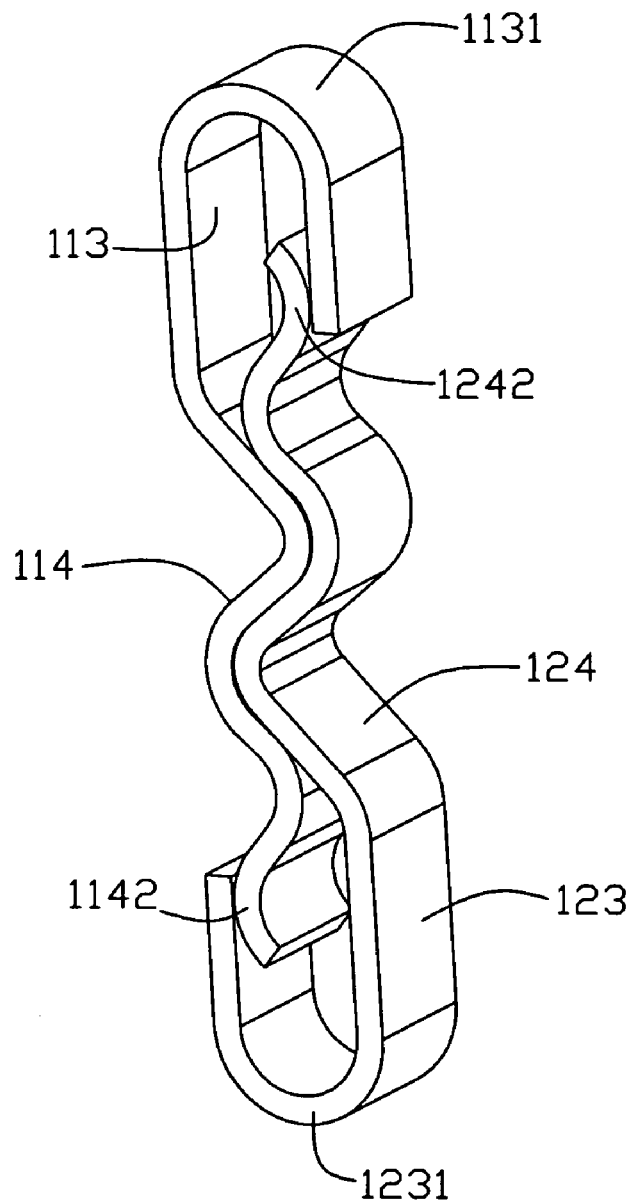
FIG. 2 is a assembly diagram of said contact in FIG. 1.
Figure 3:
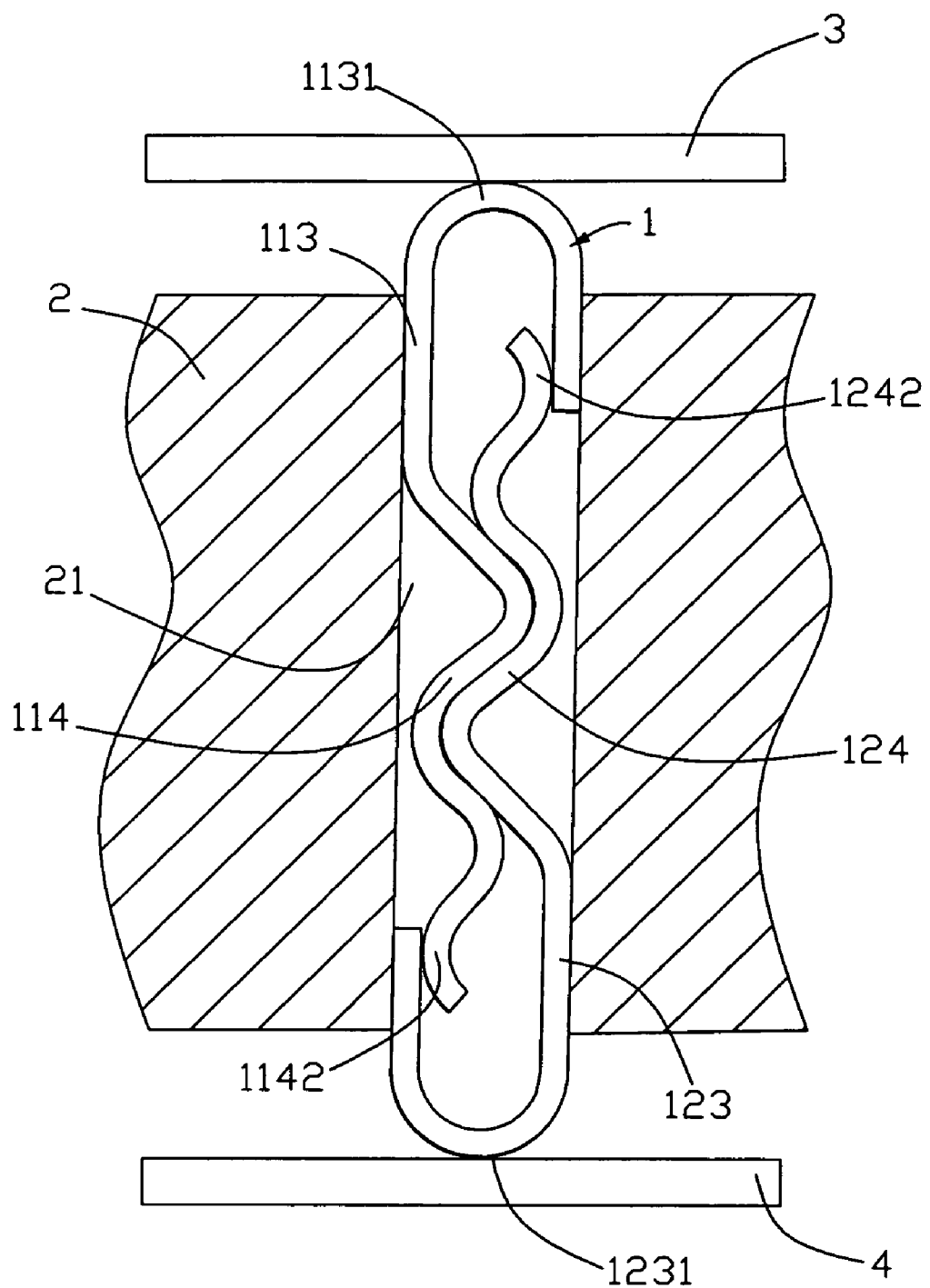
FIG. 3 is a schematic, cross-sectional view of part of the present connector before installed the LGA package and the PCB.
Figure 4:
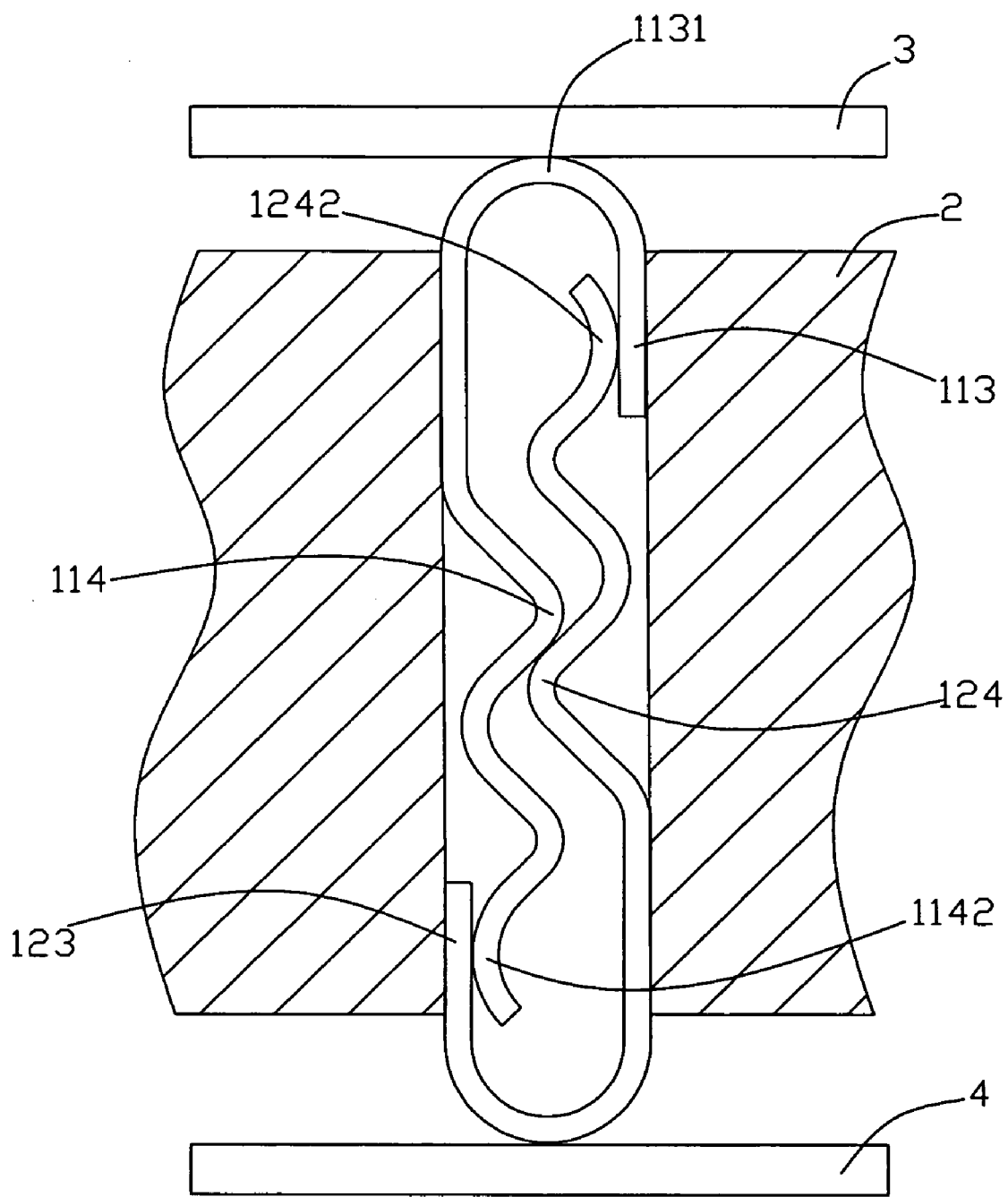
FIG. 4 is a schematic, cross-sectional view of part of the present connector installed with the LGA package and the PCB.

Referring to FIGS. 1-3, an electrical connector in accordance with the preferred embodiment of the present invention is used for electrically connecting an electronic package, such as a land grid array (LGA) central processing unit (CPU) 3, with a circuit substrate, such as a printed circuit board (PCB) 4. The connector comprises an insulative housing 2 and a plurality of contacts 1 received in the housing 2. The housing 2 defines a multiplicity of passageways 21 therethrough (only one passageway 21 is shown in FIGS. 3-4 for illustration) for receiving the contacts 1 only one contact 1 is shown for illustration herein.

Referring to FIG. 1, each contact 1 comprises a first half 11 and a second half 12. The first half 11 and the second half 12 have the same structure as each other. After reversing the first half 11 180 degrees, the first half 11 and the second half 12 are in mirror images relative to each other. The first/second half 11, 12 comprises a first/second contact engaging portion 113, 123 and a waved first/second interlinked portion 114, 124 extending downwardly/upwardly from the first/second contact engaging portion 113, 123. The first/second contact engaging portion 113, 123 has a U-shaped configuration with its end forms a curved first/second mating portion 1131, 1231. The first/second interlinked portion 114 forms a curved first free end 1142.

Referring to FIG. 2, after the first and second half 11, 12 of the contact 1 are assembled together, opposite inner curved surfaces of the first and second interlinked portions 114, 124 are attached to each other with little clearance there between. The curved first free end 1142 elastically abuts against an inner surface of the free end section of the second contact engaging portion 123, while the second free end 1242 elastically abuts against an inner surface of the free end section of the first contact engaging portion 113. The first half 11 and the second half 12 are capable of sliding relative to each other.

Referring to FIG. 3, after the contact 1 is assembled to the housing 2, due to the U-shaped structure's elastic deformation, the first contact engaging portion 113 and the second contact engaging portion 123 are fixed tightly in the passageway 21 of the housing 2. The first mating portion 1131 extends beyond the upper surface of the housing 2 for electrically connecting with the CPU 3, the second mating portion 1231 extends beyond the bottom surface of the housing 2 for electrically connecting the PCB 4.

Referring to FIG. 4, When the CPU 3 engages with the first mating portion 1131 of the contact 1, the CPU 3 exerts a downward force to the first mating portion 1131 of the contact 1. The first interlinked portion 114 moves downwardly along the second interlinked portion 124, and the first free end 1142 of the first interlinked portion 114 slide downwardly along the inner surface of the second contact engaging portion 123, the first contact engaging portion 113 slide downwardly with the inner surface engaged with the second free end 1242 of the second interlinked portion 124, finally, the first interlinked portion 114 contact with the second interlinked portion 124 with only one point. The two-half structure of the contact 1 in this invention reduces the pitch between each two contacts 1. Further, the socket size is correspondingly reduces and the number of the contacts 1 increase.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector comprising:
   an insulative housing defining a plurality of passageways extending through opposite upper and lower faces of the housing;
   a pair of contact units commonly disposed in each of said passageways, said contact unit including a J-shaped contacting section exposed outside of the corresponding one of said upper and lower faces, a serpentine engagement section disposed in a middle portion of the corresponding passageway and engaged with that of the other contact unit; wherein
   when the contact units are compressed by external parts toward each other in a vertical direction, the serpentine engagement section enhances the lateral engagement forces thereof, wherein when the contact units are relaxed, the serpentine engagement sections of said pair of contact units compliantly engaged with each other, wherein serpentine engagement sections are not compliantly engaged with each other.

* * * * *